United States Patent [19]
Davis et al.

[11] Patent Number: 5,640,339
[45] Date of Patent: Jun. 17, 1997

[54] CACHE MEMORY INCLUDING MASTER AND LOCAL WORD LINES COUPLED TO MEMORY CELLS

[75] Inventors: Andrew Davis, Essex Junction; David Wills Milton, Underhill, both of Vt.

[73] Assignee: International Business Machines Corporation, Armonk, N.Y.

[21] Appl. No.: 662,890

[22] Filed: Mar. 11, 1996

Related U.S. Application Data

[63] Continuation of Ser. No. 60,776, May 11, 1993.

[51] Int. Cl.6 .............................. G11C 7/00; G11C 8/00; G06F 13/00
[52] U.S. Cl. ................ 365/63; 364/DIG. 1; 364/DIG. 2; 365/49; 365/51; 365/230.06; 395/481
[58] Field of Search ...................... 364/DIG. 1, DIG. 2; 365/51, 49, 63, 230.03, 230.06; 395/481, 486, 487

[56] References Cited

U.S. PATENT DOCUMENTS

| | | | |
|---|---|---|---|
| 4,596,000 | 6/1986 | Wiedmann | 365/72 |
| 4,714,990 | 12/1987 | Desyllas et al. | 395/425 |
| 4,811,209 | 3/1989 | Rubinstein | 395/425 |
| 4,910,656 | 3/1990 | Scales, III et al. | 395/425 |
| 4,914,582 | 4/1990 | Bryg et al. | 395/425 |
| 5,014,240 | 5/1991 | Suzuki | 365/49 |
| 5,019,971 | 5/1991 | Lefsky et al. | 395/250 |
| 5,060,136 | 10/1991 | Furney et al. | 395/425 |
| 5,067,078 | 11/1991 | Talgam et al. | 395/400 |
| 5,113,510 | 5/1992 | Hillis | 395/425 |
| 5,155,824 | 10/1992 | Edenfield et al. | 395/425 |
| 5,175,833 | 12/1992 | Yarkoni et al. | 395/425 |
| 5,255,224 | 10/1993 | Galbi et al. | 365/189.09 |
| 5,371,712 | 12/1994 | Oguchi et al. | 365/230.06 |
| 5,394,374 | 2/1995 | Ishimura et al. | 365/230.06 |

FOREIGN PATENT DOCUMENTS 0352806   7/1989   European Pat. Off. .

OTHER PUBLICATIONS

IEEE Journal of Solid–State Circuits, vol. 26, No. 11, Nov. 1991, New York US, pp. 1586–1592, Kobayaski et al. 'A 0.5–w 64 Kilobyte Snoopy Cache Memory With Pseudo Two–port Operation'.

*Primary Examiner*—Tod R. Swann
*Assistant Examiner*—Tuan V. Thai
*Attorney, Agent, or Firm*—Howard J. Walter, Jr.

[57] ABSTRACT

An integrated cache architecture that has low power consumption, high noise immunity, and full support of an integrated validity/LRU cache write mode. A first plurality of memory cells coupled to the master word lines stores access information corresponding to a plurality of data words stored in a second plurality a memory cells coupled to a plurality of local word lines. The cache stores tag, index and Least Recently Used (LRU) information directly on a master word line, and cache line data on local word lines. The access information is made available early in the cycle, allowing the cache to disable local word lines that are not needed. By laying out the master and local word lines in a metal layer that substantially renders the stored data immune to overlaying noise sources, high frequency interconnections can be made over the cache without disturbing the stored data. The cache includes circuitry for efficiently updating the stored LRU information, such that a combined data validity/full LRU cache update protocol is supported.

3 Claims, 10 Drawing Sheets

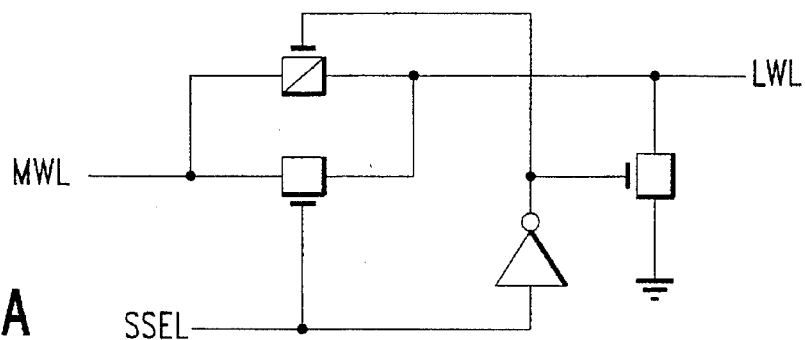
FIG. 11A
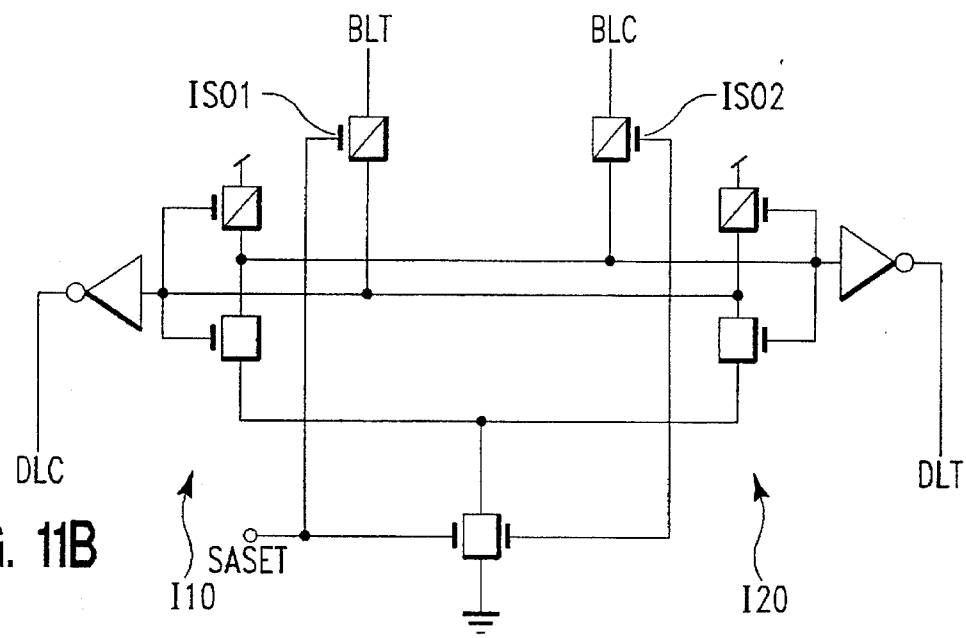
FIG. 11B
FIG. 12
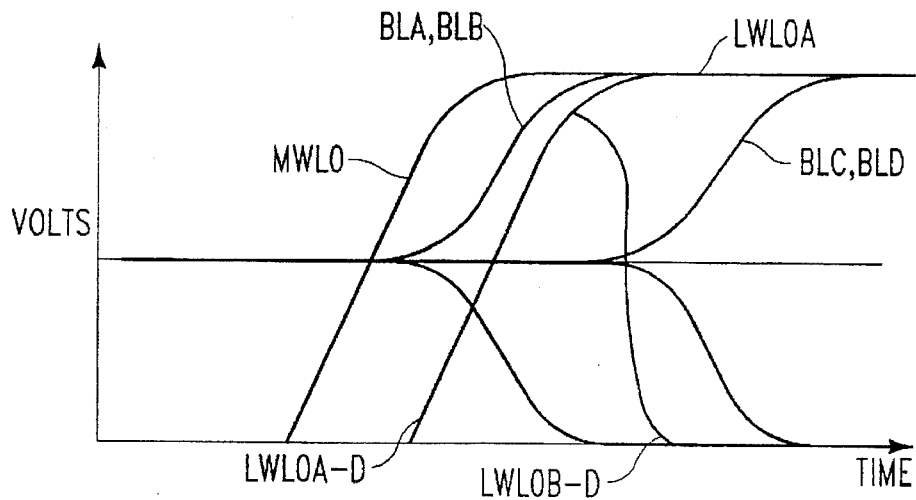

|  | POWER UP | |
|---|---|---|
|  | MSB | LSB |
| MSB1 | 0 | 0 |
| MSB2 | 0 | 0 |
| MSB3 | 0 | 0 |
| LRU | 0 | 0 |

FIG. 13A

|  | ACCESS A | |
|---|---|---|
|  | MSB | LSB |
| MSB1 | 0 | 0 |
| MSB2 | 0 | 0 |
| MSB3 | 0 | 0 |
| LRU | 0 | 0 |

FIG. 13B

|  | ACCESS C | |
|---|---|---|
|  | MSB | LSB |
| MSB1 | 1 | 0 |
| MSB2 | 0 | 0 |
| MSB3 | 0 | 0 |
| LRU | 0 | 0 |

FIG. 13C

|  | ACCESS B | |
|---|---|---|
|  | MSB | LSB |
| MSB1 | 0 | 1 |
| MSB2 | 1 | 0 |
| MSB3 | 0 | 0 |
| LRU | 0 | 0 |

FIG. 13D

|  | ACCESS D | |
|---|---|---|
|  | MSB | LSB |
| MSB1 | 1 | 1 |
| MSB2 | 0 | 1 |
| MSB3 | 1 | 0 |
| LRU | 0 | 0 |

FIG. 13E

|  | ACCESS A | |
|---|---|---|
|  | MSB | LSB |
| MSB1 | 0 | 0 |
| MSB2 | 1 | 1 |
| MSB3 | 0 | 1 |
| LRU | 1 | 0 |

FIG. 13F

|  | ACCESS B | |
|---|---|---|
|  | MSB | LSB |
| MSB1 | 0 | 1 |
| MSB2 | 0 | 0 |
| MSB3 | 1 | 1 |
| LRU | 1 | 0 |

FIG. 13G

|  | ACCESS A | |
|---|---|---|
|  | MSB | LSB |
| MSB1 | 0 | 0 |
| MSB2 | 0 | 1 |
| MSB3 | 1 | 1 |
| LRU | 1 | 0 |

FIG. 13H

|  | LRU ACCESS | |
|---|---|---|
|  | MSB | LSB |
| MSB1 | 1 | 0 |
| MSB2 | 0 | 0 |
| MSB3 | 0 | 1 |
| LRU | 1 | 1 |

FIG. 13I

CACHE MEMORY INCLUDING MASTER AND LOCAL WORD LINES COUPLED TO MEMORY CELLS

This application is a continuation of application Ser. No. 08/006,776 filed on May 11, 1993.

BACKGROUND OF THE INVENTION

1. Technical Field

The invention relates generally to the field of memory architectures, and more specifically to low-power cache designs.

2. Background Art

In microprocessor design, typically the key factor that prevents greater performance is the cycle time of data accesses to main memory. State-of-the-art dynamic random access memory (DRAM) typically has access times on the order of 60–80 nanoseconds, with data rates on the order of 40 nanoseconds in page mode or other pipelined access mode operations. Even at this speed, it takes far longer to access data than it does to process instructions through the CPU.

In order to address this problem, cache memory has been used to store data for processor operations. Typically, data is downloaded from the DRAM main memory to the cache. The cache is typically made up of an array of static RAM cells (SRAMs can be accessed at rates far faster than those of DRAMs—current state of the art SRAMs can produce data rates on the order of 5 nanoseconds). There are a number of known branch prediction or initial cache loading algorithms that determine how the cache is to be initially loaded with data.

The cache is then accessed by determining whether or not it is storing the data that is needed by the processor for a particular operation. This is done by comparing address data (referred to as the "tag") that indicates the location in main memory from which data is to be obtained, with the tag corresponding to the data as stored in the cache. If the incoming tag matches the stored tag for data in the cache, a cache "hit" signal is generated to indicate that the desired data is stored in the cache. Note that tag protocol can be set up to be "direct mapped" (i.e., each tag corresponds to one line of data stored in the cache) or "set associative" (i.e. a single "index address," or address for a single set, corresponds to a given number of lines of data stored in the cache, each having an associated tag). Thus, for example, in a "4-way set associative" cache, a single index address corresponds to four lines of data in the cache, each having its own tag.

Typically, caches also use data indicating the validity of the data stored in the cache. In general, all caches follow some sort of cache coherency protocol, to insure that the data stored in the cache is the same as data stored in main memory. Thus, for example, after the data as stored in the cache is updated, it must be written into main memory. In a "copy back cache" coherency protocol, whenever data is written to cache, it is written from the cache to main memory at some later time when there is no other traffic on the bus, using any one of a number of known algorithms. In a "write through" cache coherency protocol, when new data is written to the cache, it is written to main memory in the next cycle, suspending other conflicting bus operations. This priority write-back operation insures that for a given common address the main memory and cache store the same data. In the "copy back" mode, if a cache entry contains data at the accessed address that is not the same as the data in main memory for that address, either the cache or the main memory must be updated, depending on which is storing valid data. In practice, "bus snooping" and other techniques can be used to determine the source of data in the main memory. If data was written to main memory from an external source, chances are that it is the data in the cache that is invalid. Rather than updating the cache entry with the correct data from main memory, a data bit (commonly referred to as a "data valid" or "validity" bit) is switched (e.g. from a 1 to a 0 state) to indicate that the cache does not store valid data at that address, and at some convenient time valid data will be written from main memory to the cache.

The state of the validity bits is used to determine whether or not data must be fetched from main memory. That is, even if the tags match, if the data is not valid in the cache it must be fetched from main memory. The state of the validity bits is also used to determine where the data from main memory should be stored. When data is stored in the cache from main memory, the status of the validity bits at the accessed set will be checked, with the data from main memory being written to whichever set is storing invalid data. Another method used to determine where fetched data is to be stored is the so-called "least recently used" protocol, in which cache data is replaced based on some sort of determination of what data in the cache has been unused for the longest time (and hence is least likely to be needed for future cache accesses). However, as pointed out in U.S. Pat. No. 4,811,209, "Cache Memory With Multiple Valid Bits For Each Data Indication the Validity Within Different Contents," (issued 3/89 to Rubinstien and assigned to Hewlett Packard) conventional LRU algorithms tend to be difficult to implement in hardware and can be subject to long execution cycles, so it is more common to simply set up a priority system wherein if all the lines of data (or "cache lines") in a given set are valid, the "first" cache line will always be replaced, followed by the second, etc.

Typically, caches are implemented by a first chip that stores the index data, and separate registers (e.g. on the memory management unit or the bus master) that store the corresponding tag data, validity bits, and LRU information. That is, even though the tag and index data is accessible at the same address, they are typically located in different arrays. See for example U.S. Pat. No. 5,014,240, "Semiconductor Memory Device," (issued 5/91 to Suzuki and assigned to Fujitsu Ltd.), particularly FIGS. 2–4. However, there have been cache designs proposed in which the cache, tag, and validity information is all stored at the same physically addressable locations. Such designs are advantageous in that they reduce the total silicon area devoted to cache storage, reduce unnecessary replication of support circuits such as address buffers, address decoders, etc. needed to support data stored in physically different arrays, and remove design overhead from other microprocessor components such as bus controllers or memory managers. See e.g. FIG. 1 of the above-cited U.S. Pat. No. 5,014,240 patent; U.S. Pat. No. 4,714,990, "Data Storage Apparatus" (issued 12/87 to Desyllas et al. and assigned to International Computers Ltd.); and U.S. Pat. No. 4,914,582, "Cache Tag Lookaside," (issued 4/90 to Bryg et al. and assigned to Hewlett-Packard Co.).

However, the designs set forth in the above patents for implementing caches with both data and associated "access" information (i.e. information that is used to determine whether or not the index data is to be accessed, such as the tag address, the validity data, the LRU data, etc.) are stored at the same physical addressable location do not optimize the cache architecture for high performance. Typically, when the index address indicates that a cache line is to be accessed, the line is read (that is, the line driver circuits are enabled to access the cells, the sense amps are set to detect the data, etc.). Then, if the access information indicates that data is not to be accessed during that given cycle, the data input/output drivers are inhibited. Thus, for example if the incoming tag address is not the same as one of the tag address(es) associated with the accessed cache index, then a cache "miss" is generated and the cache access is terminated. The problem with this approach is the extra power that has been consumed in preparing the data for access. In workstation and other high-end computer applications this extra power overhead can be tolerated. However, in low-power applications such as low-power personal computer applications, laptops, personal digital assistants, and the like, this power overhead becomes prohibitive.

Another shortcoming in the prior integrated cache designs is that they do not provide a true least recently used mode for updating the cache with data from main memory. Ideally the LRU hardware implementation should be integrated with the cache design to optimize the hit rate of the cache.

Typically integrated caches are laid out as separate functional units (or macros) on the microprocessor chip. Because the CPU and other functional blocks on the microprocessor receive signals from external signal sources, they must support interconnection pads that are bonded to external pins when the chip is packaged. As caches increase in size they take up more space on the microprocessor. As such, they tend to constrain the metallization patterns from the CPU, etc. to the interconnection pads, because the cache data could be disturbed by noise and/or capacitive coupling generated from overlying metallization patterns transmitting high frequency signals from external signal sources to the CPU, etc.

Accordingly, a need has developed in the art for an integrated cache design in which the benefits of storing the data and associated access information in the same physically addressable array can be realized without the attendant power overhead.

SUMMARY OF THE INVENTION

It is thus an object of the present invention to provide an integrated cache that stores both data and the associated access information in a manner that reduces power consumption.

It is another object of the present invention to provide an integrated cache architecture that provides a true least recently used cache update procedure.

It is yet another object of the present invention to provide a simple hardware implementation of an LRU cache update procedure that does not increase the cycle time of the cache.

It is a further object of the present invention to optimize the layout of the metal lines on the integrated cache of the invention to support overlying interconnect metallization from other functional blocks on the microprocessor.

It is yet another object of the present invention to facilitate adjustment of various size aspects of the cache of the invention to adapt to available area on the chip. For instance, the cache can be reduced to a 3-way set-associative or enlarged to a 5-way set associative cache. A few more bit lines can be added to provide parity checking. Note that the LRU array once initialized has constant parity, such that parity checking may be added thereto with no additional bit lines.

The foregoing and other objects of the present invention are realized by a cache formed on an integrated circuit chip for storing data fetched from a main storage means, comprising a plurality of index lines, each of said index lines having a first plurality of memory cells in a first storage area for storing main memory data and a second plurality of memory cells in a second storage area for storing access information corresponding to said main memory data, said first and second storage areas having approximately the same cycle time and said second storage area being accessed before said first storage area; a first controller receiving said access information for a selected one of said plurality of index lines for detecting, for a given one of said plurality of index lines, whether any of said main memory data stored in said first storage array is to be accessed; and an array controller for selectively deactivating at least a portion of said first storage array of said selected one of said plurality of index lines before an access cycle thereto has been completed.

In another aspect of the present invention, the cache array comprises a plurality of memory cells; a plurality of supply voltage lines disposed above and coupled to said plurality of memory cells; a plurality of master word lines disposed above said plurality of memory cells; a plurality of local word lines disposed above said plurality of memory cells, said plurality of supply voltage lines, said plurality of master word lines, and said plurality of local word lines being disposed substantially in parallel, each of said plurality of master word lines being coupled to a set of said plurality of local word lines, a set of said plurality of memory cells being coupled to one of said set of said plurality of local word lines, each of said plurality of master word lines and at least one of said set of local word lines being disposed over said set of said plurality of memory cells coupled to said one of said set of local word lines, portions of said master word line being isolated from remaining portions thereof and being coupled to one of said supply voltage lines.

In yet another aspect, the present invention comprises a central processor unit, a main memory for storing data, and a cache unit having a plurality of index lines, each of said index lines storing a plurality of data words from selected locations in said main memory, a method of writing an update data word from said main memory to said cache, comprising the steps of:

for a given index line, determining if any of said plurality of data words are invalid, and if so writing said update data word in a portion of said given index line that stores said invalid data word;

updating first access data for said given index line to reflect that said portion of said given index line that formerly stored said invalid data word now stores valid data;

if all of said plurality of data words are valid for said given index line, determining which of said plurality of data words was least recently accessed by said central processing unit, and writing said update data word in a portion of said given index line that stores said least recently accessed data word; and updating second access data for said given index line to reflect that said portion of said given index lines that previously stored said least recently accessed data word has been recently accessed, to indicate that a different one of said plurality of data words on said given index line was least recently accessed by said central processing unit.

BRIEF DESCRIPTION OF THE DRAWING

The foregoing and other structures and features of the invention will be described in more detail with reference to the Drawing appended hereto. The Drawing includes several Figures illustrating various aspects of the invention, as follows:

FIGS. 11A and 11B are circuit schematics of the local word line drivers and sense amplifiers, respectively, of FIG. 4;

FIG. 12 is a simplified timing diagram showing the relative access timing for the master and local word lines of the array shown in FIG. 4;

FIGS. 13A–13I are a sequence of tables illustrating the update of data in the LRUA array for sequential access cycles;

DESCRIPTION OF THE BEST MODE FOR CARRYING OUT THE INVENTION

Figure 1:
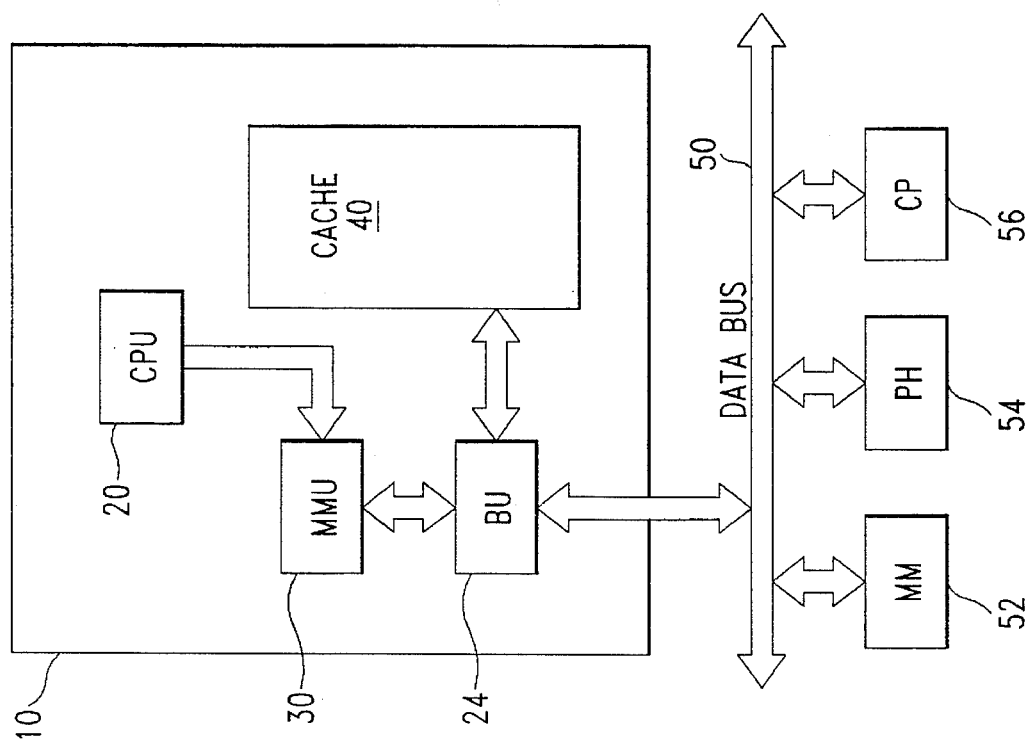
FIG. 1 is a block diagram of a microprocessor chip in accordance with a first embodiment of the present invention.

With reference to FIG. 1, a first embodiment of the present invention is a microprocessor module 10 having on a single integrated circuit chip 10 a CPU 20, a memory management unit (MMU) 30, and cache storage (CACHE) 40. As is conventional practice in the X86 line of microprocessors, the CPU 20 includes an execution unit, a fetch unit, etc., not specifically shown for ease of illustration. The bus unit (BUS) 24 communicates with peripheral devices such as main memory (MM) 52, a coprocessor (CP) 56, and a keyboard or other peripheral (PH) 54 via a data bus 50. In general, the microprocessor operates by fetching instructions from the main memory 52 through the bus 50 and the bus unit 24, or by fetching instructions from the cache through bus unit 24. The microprocessor then executes the instructions by processing through the CPU 20, accessing data as needed from the cache 40 under control of the memory management unit 30, and storing the result of the instruction execution in either the cache 40 or main memory 52 (preferably in both by some sort of cache coherency protocol, to be discussed in more detail below).

Figure 2:
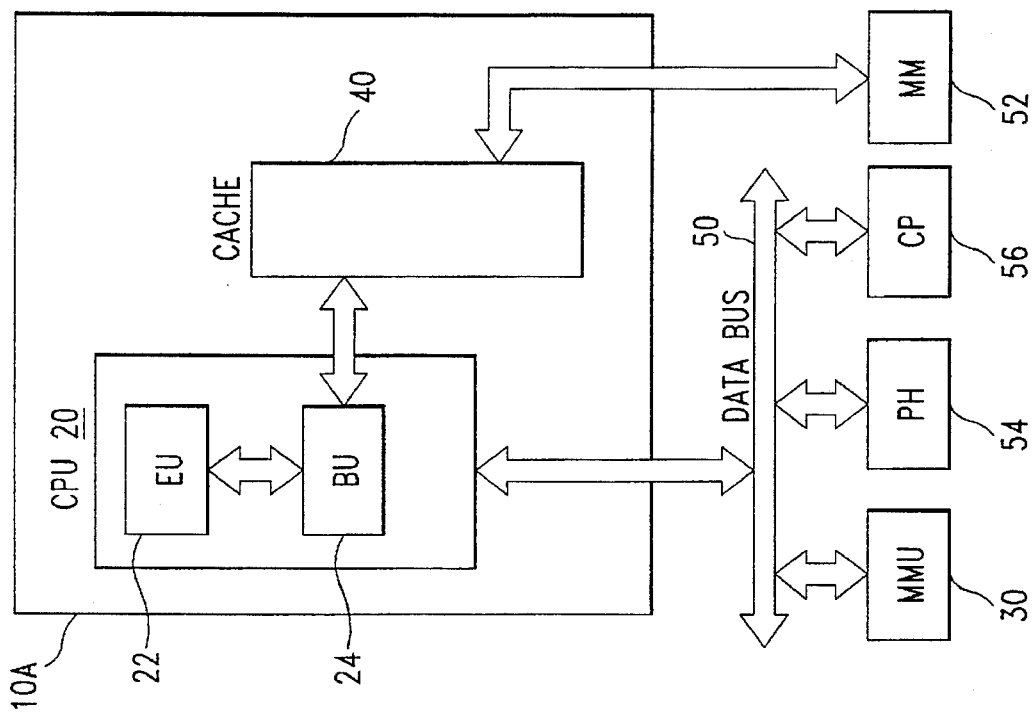
FIG. 2 is a block diagram of a second microprocessor chip in accordance with a second embodiment of the present invention.

An alternative embodiment is shown in FIG. 2. In FIG. 2, circuit blocks having similar construction and operation with those of FIG. 1 are indicated with like reference numerals. The essential difference between the embodiments shown in FIGS. 1 and 2 is that the embodiment shown in FIG. 2 has been designed to minimize chip area. Specifically, note that the memory management unit 30 is not integrated onto the microprocessor, but rather communicates with the microprocessor through the data bus 50 and the bus unit 24. Moreover, to minimize the delays attendant with cache writeback to main memory in cache coherency operations, note that the cache 40 sends and receives data through its own dedicated memory bus 58 to the main memory 52.

In both embodiments, the cache 40 is integrated with the other circuitry on the microprocessor 10. By having these circuit blocks on the same chip, process sensitivities and other performance detractors resulting from these structures being formed on different chips using different processing techniques, etc. are minimized.

Figure 3:
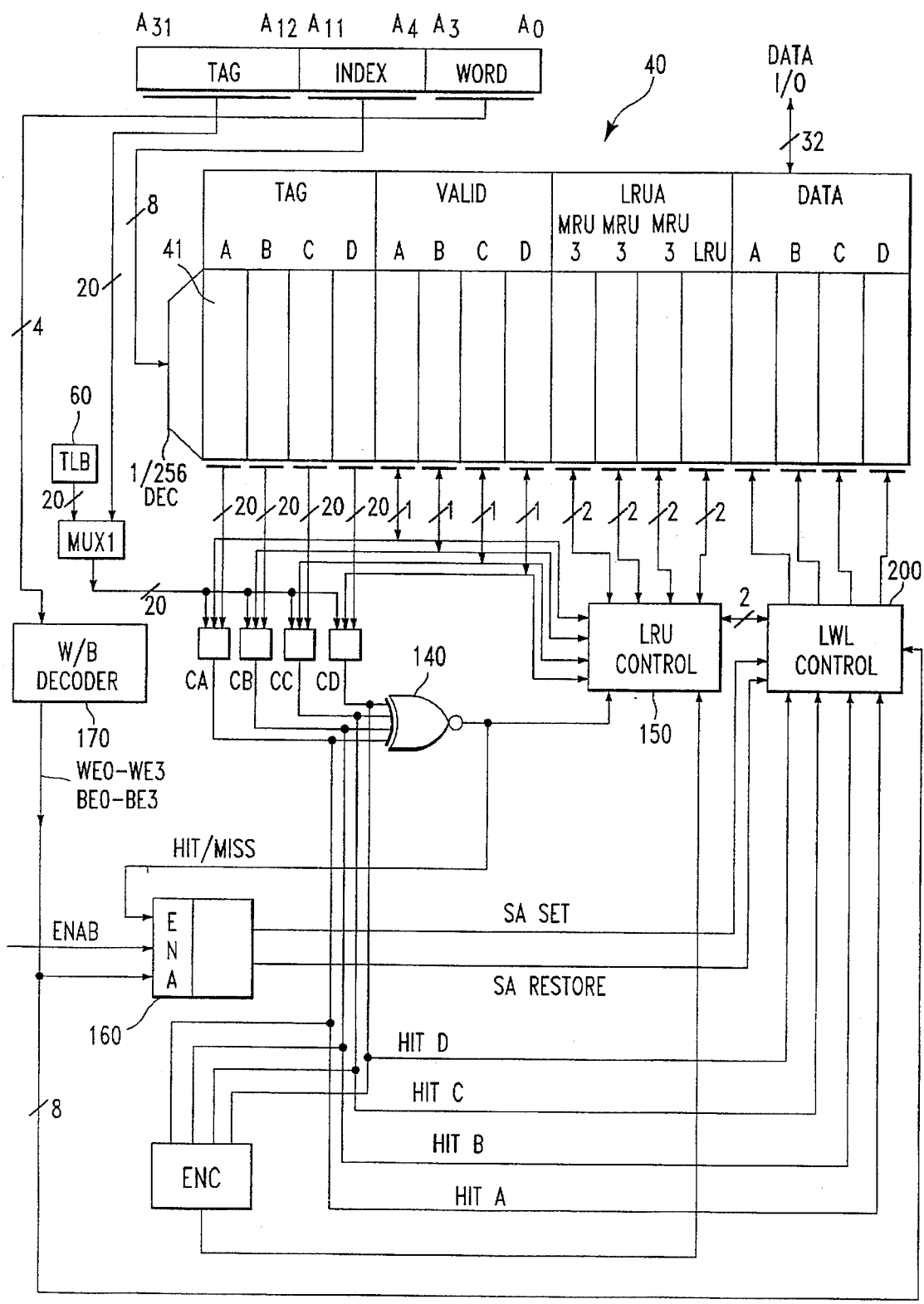
FIG. 3 is a logic block diagram of the integrated cache of the invention, illustrating how the access address accesses the tag, validity, and index data stored in the cache.

An overall block diagram of the cache 40 of FIG. 1 and 2 is shown in FIG. 3. The cache 40 includes a storage array 41. The array includes a DATA portion that stores four cache lines A–D, a TAG portion that stores tags A–D corresponding to the four cache lines, an LRUA portion that stores the least recently used information in storage areas MRU1, MRU2, MRU3, and LRU, and a valid portion that stores the data valid information for each cache line A–D. A feature of the invention is that all of this data for a single set is stored on a single, physically addressable word line. Thus, as will be discussed in more detail below, a single word line is coupled to memory cells in each of the above-mentioned arrays, such that by accessing a single physically addressable word line all of the aforementioned data can be accessed.

In general, the cache 40 is accessed in response to an ACCESS ADDRESS generated by the fetch or load/store unit received by the cache 40 from the bus unit 24, which in turn receives this address from the execution unit 22. Note that the invention can also be used in a parallel processing or coprocessor mode, in which such addresses could be generated from off-chip sources such as coprocessor 56, or a peer processor communicating with the cache 40 as a peripheral device 54. In these modes, the cache 40 can be accessed by these other processors by either standby status operations (i.e. the other processors can access the cache 40 only when it is not servicing access requests from the CPU 20), or any one of a number of known priority interrupt protocols (i.e. the bus unit 24 arbitrates between the priority levels of access requests from the CPU 20 and these other devices).

Regardless of where the address comes from, it will be provided in the same general 32-bit format. Note that a 32-bit address is given solely by way of example, other address bit lengths could be used. The twenty most significant bits $A_{31}$–$A_{12}$ indicate the tag address (that is, the address of the data to be accessed from main memory), the next eight bits $A_{11}$–$A_4$ indicate the index address (that is, the address of the set storing the data), and the least significant bits $A_3$–$A_0$ indicate which byte of data within the accessed data word is to be accessed. More specifically, $A_3$ and $A_2$ indicates which 32-bit subword of the accessed 128-bit data word is to be accessed, and $A_1$ and $A_0$ indicates which 8-bit byte within the accessed 32-bit subword is to be accessed.

When the microprocessor is operating in the cache TAG HIT/MISS mode, the 20-bit virtual tag received by the cache is compared with the tags stored at the indicated index address. That is, the cache carries out a 1-in-256 decode (using conventional CMOS address buffers and decoders) to determine which one of 256 word lines (or sets) are accessed by the index address. By accessing a given set, the associated tags are read, and the read tags are compared to the received tag. When the microprocessor is operating in virtual mode the received tag may come from a translation lookaside buffer (TLB 60). Because the virtual address must be remapped to an actual physical address, this remapping may be performed directly from the CPU or by the use of a TLB. MUX 1 will output the TLB input when the microprocessor is in virtual mode, otherwise it will simply pass the tag ACCESS ADDRESS.

Comparators CA–CD compare the tag passed by MUX 1 to the tags A–D stored at the accessed set, from the TAG portion of the cache array. Note that in this case, the cache is 4-way set associative, meaning that for a given set four tags are stored. The invention could be applied to any n-way set associative architecture. Note that the comparators CA–CD also receive the validity bits from the VALID portion of the array corresponding to each cache line A–D. If a given validity bit is low, the associated cache line is storing invalid data. The validity bits are used as override inputs to the comparators, meaning that if the validity bit is low the comparison will be overridden and a cache miss will be indicated. The comparators CA–CD have respective outputs labeled HITA, HITB, HITC, and HITD. Normally these lines are held high. If one of the comparators CA–CD determines that the input tag and the tag from the accessed set match, its associated output HITA–D will remain high, and the remaining output lines will be pulled low.

The four outputs HITA–D are compared by XOR 140 to determine if any indicate that a cache hit has occurred. If a cache hit has occurred, the output will go high. This signal, along with the validity bits, is received by the LRU CONTROL 150. As will be described in more detail below, in the event of a cache hit the LRU CONTROL 150 will update the least recently used information stored in the LRUA array, and in the event of a cache miss, a subsequent cache update cycle will store data fetched from main memory at a selected cache line as a function of the states of the validity bits and the information stored in the LRUA array.

The HITA–D outputs are also received by the LWL CONTROL 200, which controls access to the cache lines A–D in the DATA array. The LWL CONTROL 200 also receives inputs SA SET and SA RESTORE from read/write control 160, and word/byte selection signals B0–B3 and W0–W3 from W/B DECODER 170. As will be described in more detail below, in a cache access cycle all of the memory cells of the desired word in the accessed set are initially accessed to obtain the TAG, VALID, and LRU information as described above, as a function of the word/byte selection information. Then, the undesired portions of the accessed set will be deactivated before completion of their full access cycle, as a function of the cache hit information, providing a significant power savings. For example, if what is desired is access to subword 3 of cache line A, all of the subwords 0,1, and 2 will never be activated and other subword 3's of cache lines B–D will be disabled prior to completion of the access cycle. In addition, if only byte 1 of subword 3 is required, then only bytes 0 and 1 of each subword 3 will be accessed with the undesired portions disabled once the HITA information becomes available (see FIG. 9).

Figure 4:
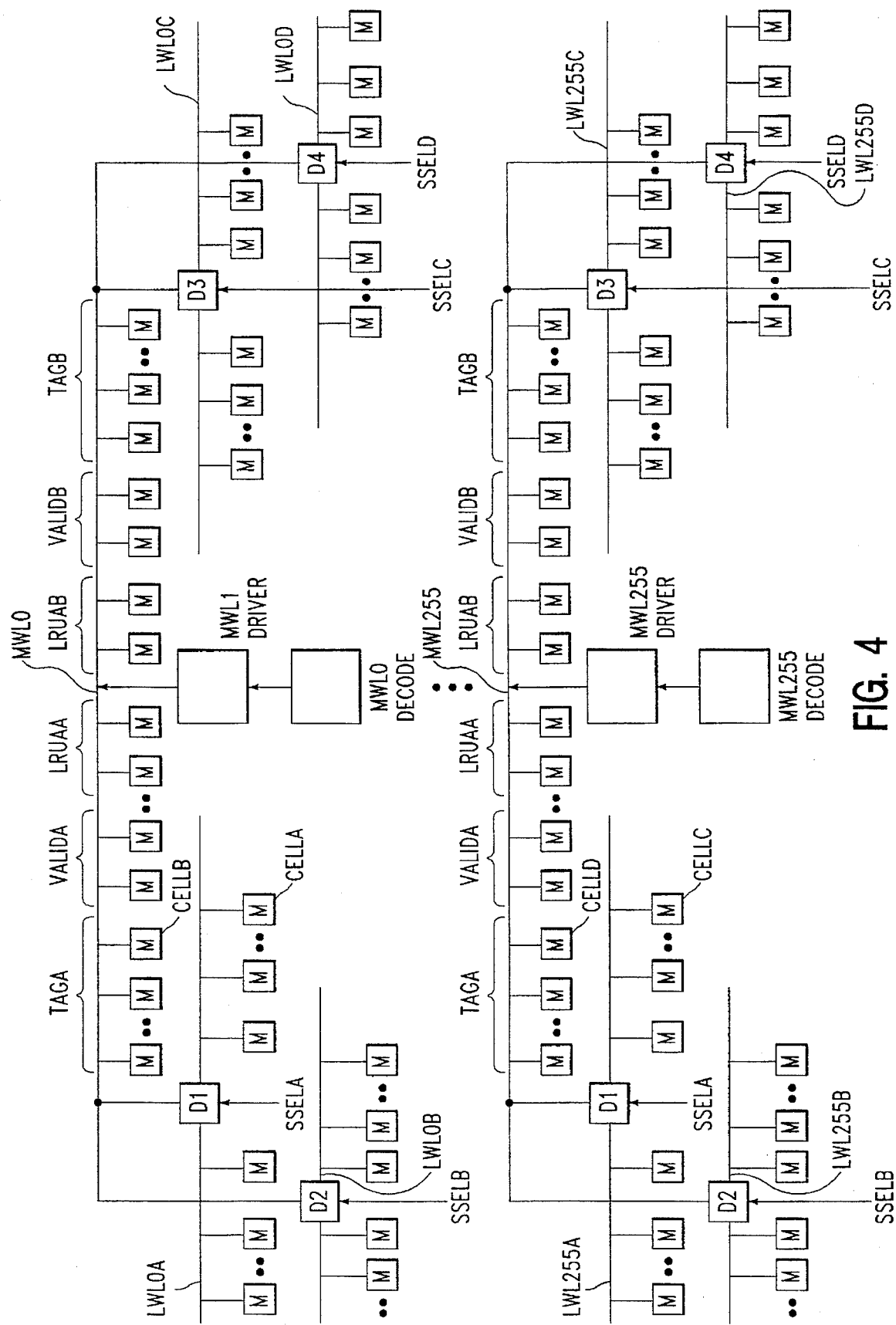
FIG. 4 is a schematic diagram of the master/local word line arrangement of the memory arrays of the invention.

FIG. 4 is a circuit diagram of a portion of the array 41 of the integrated cache 40 of the invention. The array includes a plurality of master word lines MWL0 through MWL255 (for ease of illustration, only the first master word line MWL0 and last master word line MWL255 are shown, the remainder being generally indicated by the dotting in the middle of the Figure. In practice, the cache would include at least four redundant master word lines, and a dummy word line for timing purposes). The received index address $A_{11}$–$A_4$ will be decoded by the master word line decoders MWL0 DECODE through MWL255 DECODE to determine which of the 256 master word lines are to be enabled. These decoders are conventional CMOS NOR decoders (although NAND decoders could be used) that receive the address inputs from on-chip address buffers (not shown for ease of illustration). The enabled one of the decoders will activate its corresponding master word line driver MWL0 DRIVER–MWL255 DRIVER to raise the potential on the corresponding master word line MWL0–MWL255 to access the information stored on the selected set. Each master word line controls all the information—data, tags, validity bits, and LRU—for a selected set. The master word line drivers are conventional CMOS push-pull drivers, sized to drive the large capacitive load presented by these master word lines. As shown in FIG. 4, each master word line is coupled to a set of local word lines.

Figure 5A:
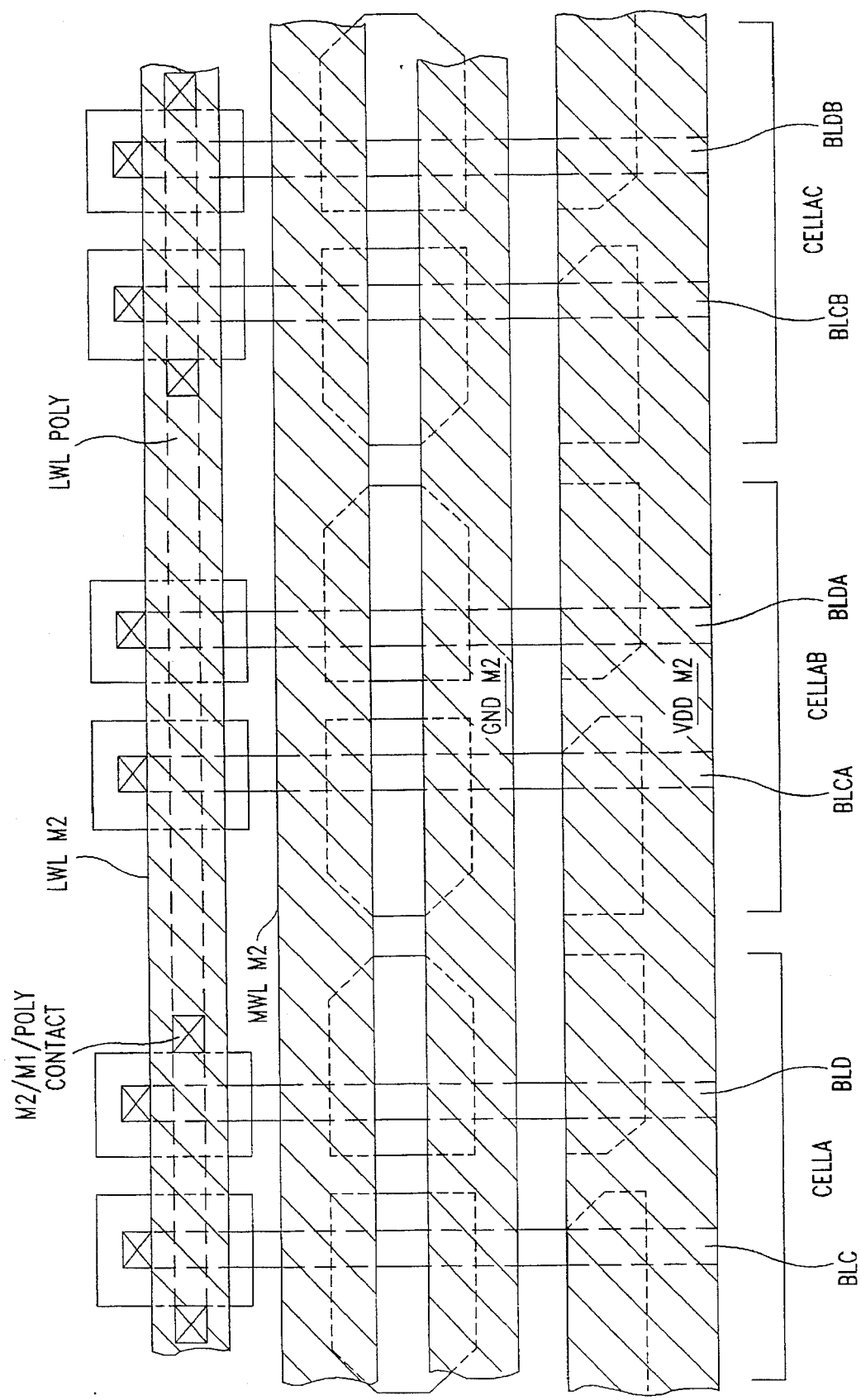
FIGS. 5A–5B are simplified top views of portions of the data array and the tag array of FIG. 4, respectively.
Figure 7:
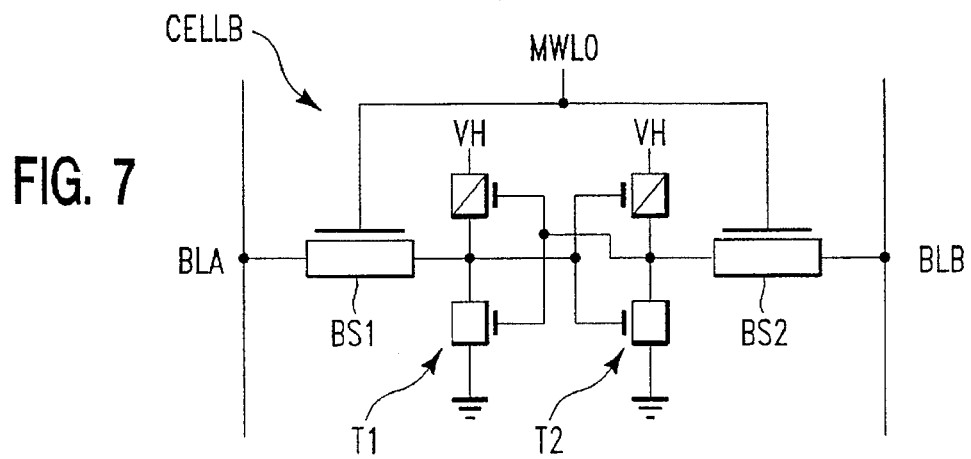
FIG. 7 is a circuit schematic of CELL A shown in FIG. 4.
Figure 8:
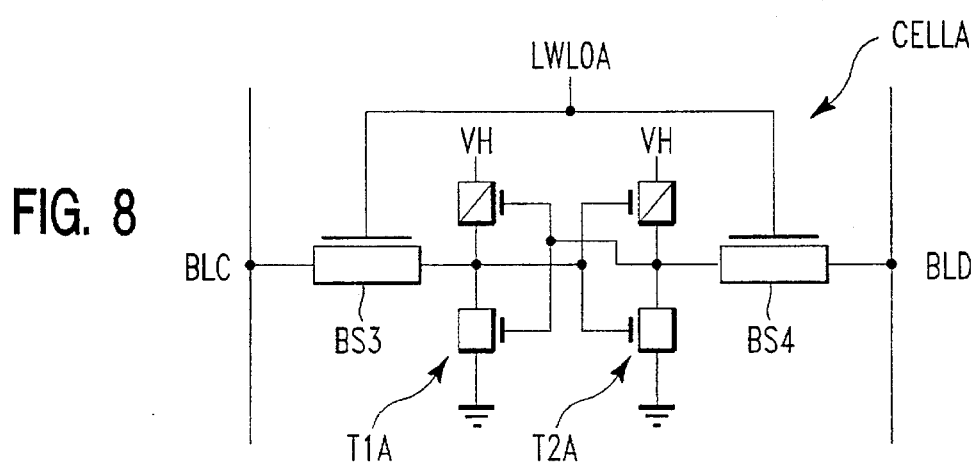
FIG. 8 is a circuit schematic of CELL C shown in FIG. 4.

In practice, in order to reduce the resistive-capacitive delay of the local word lines and increase performance, the local word lines are metal strapped. FIG. 5A is a top view of a portion of CELL A coupled to local word line LWL0A as shown in FIG. 4, along with adjacent cells CELL AB and CELL AC along LWL0A (not shown in FIG. 4 for ease of illustration). Each cell consists of a plurality of diffusion regions indicated by the hatched boxes. As shown in FIGS. 7 and 8, the memory cells utilized in the invention are of the standard six-device SRAM construction that have bit switch devices BS3, BS4 that access the cell comprising the cross-coupled device pairs T1, T2, to read from or write to the cell through bit lines BLC, BLD. A single gate conductor LWL POLY is shown that crosses over all of the cells to form the gate conductor of the cell access devices (i.e. the transistors that couple the cell to the bits lines, see e.g. transistors BS3, BS4 of FIG. 8). Obviously the polysilicon conductor would have a far more complex layout in practice, to form the gate conductors of the other devices. The complete layout of the polysilicon is not shown for ease of illustration, the key component for purposes of this description being the LWL POLY line that crosses over all of the cells in FIG. 5A. While polysilicon has been described for purposes of explanation, as a practical matter other polysilicon-based gate conductors such as a refractory metal silicide, or a sandwich structure of polysilicon and silicide, could be used. The bit lines BLC, BLD (as well as BLCA, BLDA for cell AB and BLCB, BLDB for cell AC) are formed of a first layer of metallurgy (e.g. aluminum or aluminum based alloys).

The next layer of metallurgy M2 (typically of the same composition as M1) is laid out over the chip to form substantially parallel lines. From the bottom to the top of FIG. 5A, these lines consist of VDD M2, which supplies the high voltage (e.g. 5 volts) to the cells; GND M2, which supplies ground or low potential; MWL M2, which is the master word line, and LWL M2, which forms the metal strapping for the LWL POLY. Note the contact regions M2/M1/POLY contact indicated by the crossed boxes. These contact regions provide contacts between the LWL M2 and the LWL POLY, at every other memory cell along the local word line. By virtue of this arrangement, the local word lines have reduced resistance characteristics without increasing cell pitch, allowing the selected MWL0–MWL255 to be enabled more quickly.

Figure 5B:
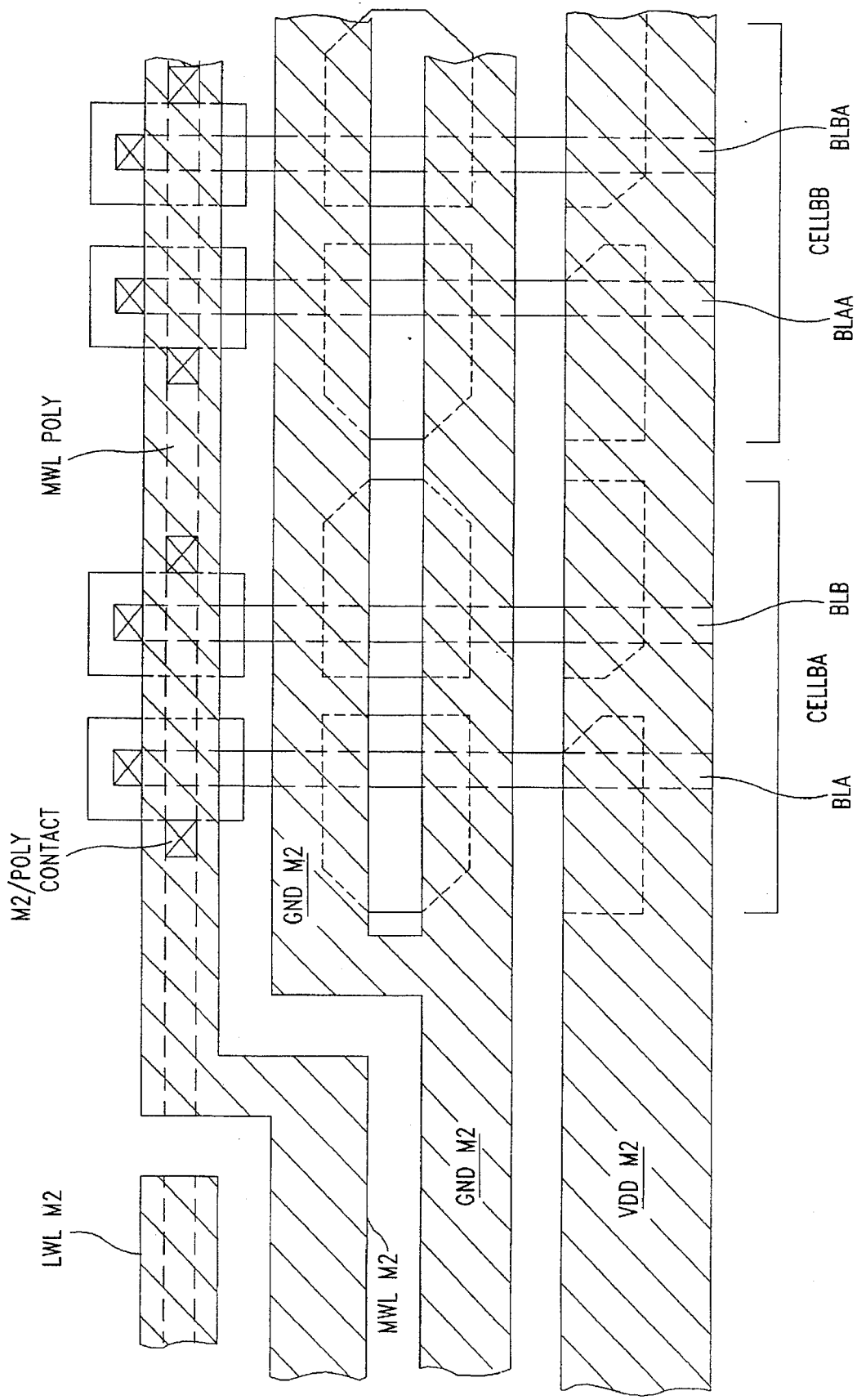

With reference to FIG. 4, a feature of the invention is that each master word line is directly coupled to and drives memory cells that store the access information (i.e., the TAG, validity, and LRU information), and indirectly drive the memory cells that store the index data through local word lines LWL0A–LWL0D. While the general idea of using "master" word lines to drive segmented word line portions is known, see e.g. U.S. Pat. No. 4,596,000, "Semiconductor Memory," issued 6/86 to Wiedmann and assigned to the assignee of the present invention, typically the "master" word line is not directly coupled to some of the memory cells. Rather, as shown most clearly in FIG. 2 of the Wiedmann patent, the master word line is typically used as an enable input to drive the local word lines. This is because master/local word line arrangements are typically used to reduce word line performance delays due to capacitive loading. As such, a designer would typically avoid loading down the master word lines by coupling memory cells directly to it. In the present invention, in addition to strapping the local word lines to M2 as described above, the master word lines laid out in M2, and cross over to contact a separated portion of the LWL M2. As shown in FIG. 5B, note that for devices coupled directly to MWL the MWL M2 crosses over from its conventional position to contact a portion of the LWL M2 that has been severed from the LWL M2 line shown in FIG. 5A. Note also that the portion of M2 which would have been the MWL has been coupled to the GND M2 to form a GND M2' conductor that crosses over the array (note that the GND M2' conductor does not have any contacts to the underlying integrated circuit). Thus, in the invention both LWL and MWL are metal conductors, such that a small number of cells can be directly coupled to the master word line without any performance penalty.

Figure 6:
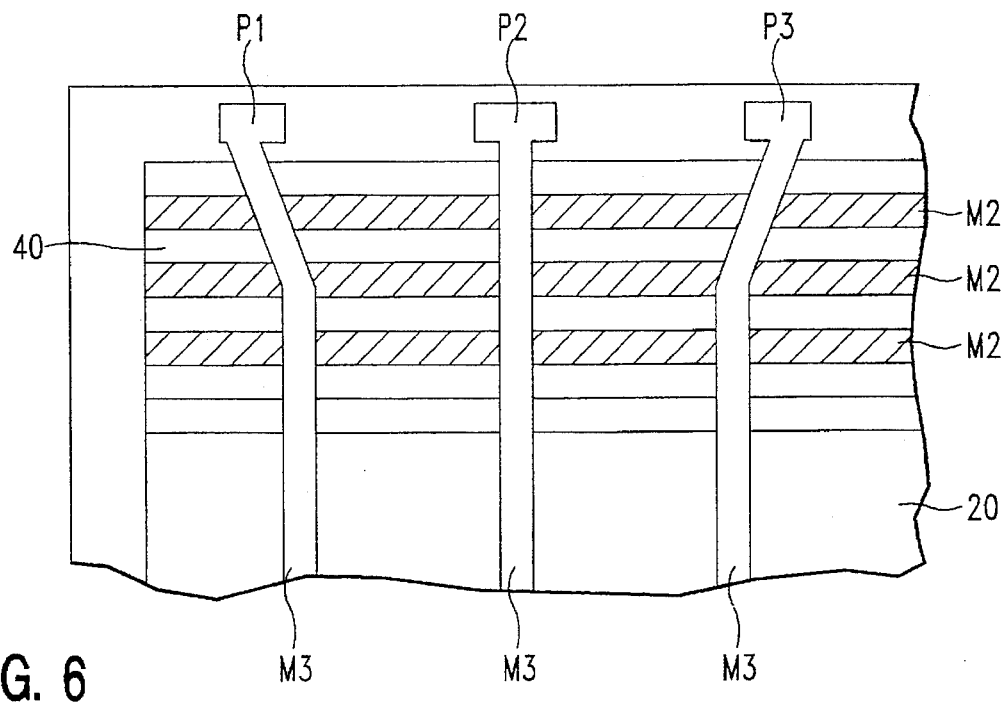
FIG. 6 is a top view of a portion of the microprocessor chip shown in FIG. 1.

A feature of this arrangement is that the array has been substantially shielded from overlying noise sources. That is, as shown in both FIGS. 5A and 5B, note that the cells are substantially covered by overlying M2. In combination these conductors will tend to produce a shielding effect that makes the logic states stored in the cells more immune to noise or capacitive coupling from overlying conductors. Thus, as shown in FIG. 6, another layer of metal M3 can be used to provide interconnections from portions of the microprocessor (e.g. CPU 20) to external signal sources through pads P1–P3 located at the periphery of the chip. In previous microprocessor chips the pad interconnects were routed around the cache array to prevent data loss, or an artificial twisting of the bit lines of the array is incorporated. The construction of the invention substantially increases the noise immunity of the chip, because all of the M2 conductors receive some active potential (that is, none are ever left floating). This is why the "unused" portion of the MWL M2 was strapped to the adjacent ground conductor.

Thus, memory cells in the TAG, LRU, and V arrays as shown in FIG. 3 are directly coupled to the master word lines MWL0 . . . MWL256, and are physically disposed close to the word line drivers MWL0 DRIVER . . . MWL256 DRIVER. In FIG. 4, the memory cells are indicated by the small boxes labeled M. The memory cells have the same general construction as that shown in FIGS. 5, 7 and 8. Note that in FIG. 4 the bit lines have been omitted for the purpose of clarity, and the number of memory cells shown has been minimized for ease of illustration (for example, in practice the TAGA, TAGB arrays would each have at least 40 memory cells, or 20 for each TAG). As conventional in SRAM array design, all the cells in the same location along the word lines in the respective arrays would be coupled to the same set of bit lines. Thus, for example, CELL B (the first memory cell along MWL0 in the TAG A array) and CELL D (the first memory cell along MWL256 in the TAG A array) are coupled to the same BLA, BLB bit lines shown in FIG. 7.

In the present invention, in order to reduce the power consumption involved in accessing the entire array, it is necessary to access the tag, etc. data before the index data is accessed. By placing the arrays storing the access information physically closest to the word line drivers, the access information will be available earlier than the index data, such that portions of the array that do not store the index data to be accessed can be deselected. In the embodiment shown in FIG. 4, the TAG, LRU, and V arrays are split into array portions TAGA, TAGB, LRUAA, LRUAB, and VALIDA, VALIDB, respectively, on either side of the word line drivers, to equalize the access times to the information in these respective arrays. However, in another embodiment of the invention, the arrays are left whole, and are disposed on one side or the other of the word line drivers. Thus, for example, the LRUAA and LRUAB arrays are combined into a single LRUA array disposed to the left of the word line drivers, and the TAGA and TAGB arrays are combined into a single TAG array disposed to the right of the word line drivers. In some applications layout considerations may dictate this latter construction.

The cache line data is stored on separate sets of local word lines. For example, for MWL0, each of the four local word lines LWL0A–LWL0D store a cache line, one for each TAG in the TAG array. Note that while four local word lines have been shown, in practice each is divided into smaller local word lines to enhance performance. For example, for each of the local word lines shown, in practice eight local word lines are used, each coupled to sixteen (eighteen if parity bits are included) memory cells. So the local word lines shown in FIG. 4 can be a single local word line or (preferably) a set of local word lines that receive the same control/enable signals. If the cache is to be constructed to support a different set associativity (e.g. an 8-way set associative cache), there would be eight cache lines, and at least eight sets of local word lines for each master word line.

The memory cells M coupled to the local word lines differ from CELL A as shown in FIG. 8 in that instead of the gates of transistors BS3, BS4 being coupled to the local word line LWL0A, they are coupled to one of the master word lines. Thus, as shown in FIG. 7, the gates of BS1, BS2 for CELL B as shown in FIG. 3 are coupled to MWL0. Also, note that the arrangement of the local word lines in FIG. 4 should not be interpreted as implying that the memory cells coupled to the local word lines would be coupled to the same bit lines as the access data; rather, for example, CELL A (a memory cell along LWL0A) would be coupled to the same set of bit lines BLC, BLD as CELL C (the memory cell at the same position along LWL255A) as shown in FIGS. 3 and 8.

In operation, one of the master word lines MWL0 . . . MWL255 are selected and driven as a function of the index address on the master word line decoders. As one of the master word lines are selected to select a given set, the information in the TAG, LRU, and VALID arrays for each of the cache lines A–D is accessed and sensed. As shown in FIG. 11B, a CMOS sense amplifier with conventional cross coupled inverter pairs is used, having p-type bit line isolation devices ISO1, ISO2 receiving as their control input the SASET signal, to isolate the bit lines from the sense amp cross coupled pair during sensing. This feature is needed to accommodate the Read-Modify-Write cycle of the LRU, TAG and Valid arrays. This sense amp is also a power reduction feature in that the bit lines are not driven throughout the cycle, thus they are never fully discharged except during a write cycle. As discussed above in conjunction with FIG. 3, if the accessed tag does not agree with the tag received from the processor, none of the cache lines A–D at the accessed set is storing the requested information and access to the cache lines is terminated by disabling the read/write enable block 160 by receipt of the MISS signal from XOR 140.

Figure 9:
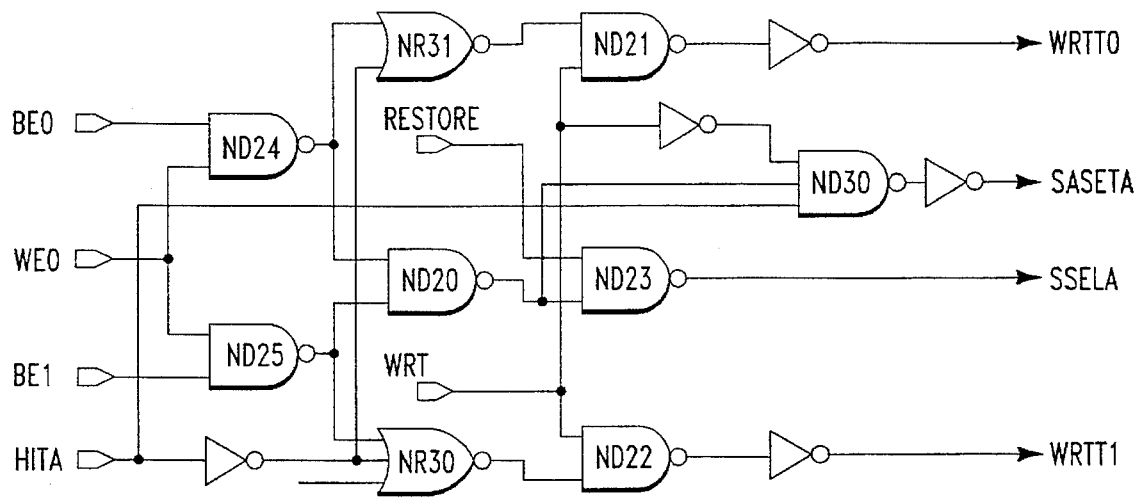
FIG. 9 is a circuit schematic of the LWL CONTROL 200 of FIG. 3.

A feature of the present invention is that in the event of a cache hit, access should continue, but only to the cache line (or portions of that cache line) that are needed to supply the requested data. This function is accomplished by the LWL CONTROL 200. FIG. 9 is a more detailed circuit diagram of LWL CONTROL 200 shown in FIG. 3. In practice the LWL CONTROL 200 would consist of thirty two circuit blocks of a construction similar to that shown in FIG. 9, eight for each cache line A–D, with differing inputs as described below. Each of the LWL CONTROL 200 blocks receives a combination of two of the four byte enable signals BE0–BE3, and one of the word enable signals WE0–WE4. Specifically, each receives either BE0 or BE2 at one input, and BE1 or BE3 at the other input. Each LWL CONTROL block also receives one of the four HITA–D signals. In the specific example shown in FIG. 9, the LWL CONTROLLER receives BE0, BE1, HIT A, and WE0. These inputs are processed through NANDs ND24, ND25, NORs NR31 and NR30 and NAND 20, NANDs ND21–ND23, inverter I1, and NAND ND30. As a result, the LWL CONTROLLER knows that there is a hit on cache line A, and that bytes 0 and 1 of the first 32-bit word 0 within the 128-bit cache line are to be accessed. As a result, the LWL CONTROLLER will produce signal SSELA to drive the local word lines for cache line A, and signal SASELA to set the sense amplifiers for the first 16 bit lines (so as to access half of WE0 only). The WRTT0 and WRTT1 signals are used to selectively enable writing to each of the selected bytes 0 and 1 in the selected 32-bit word.

Figure 10:
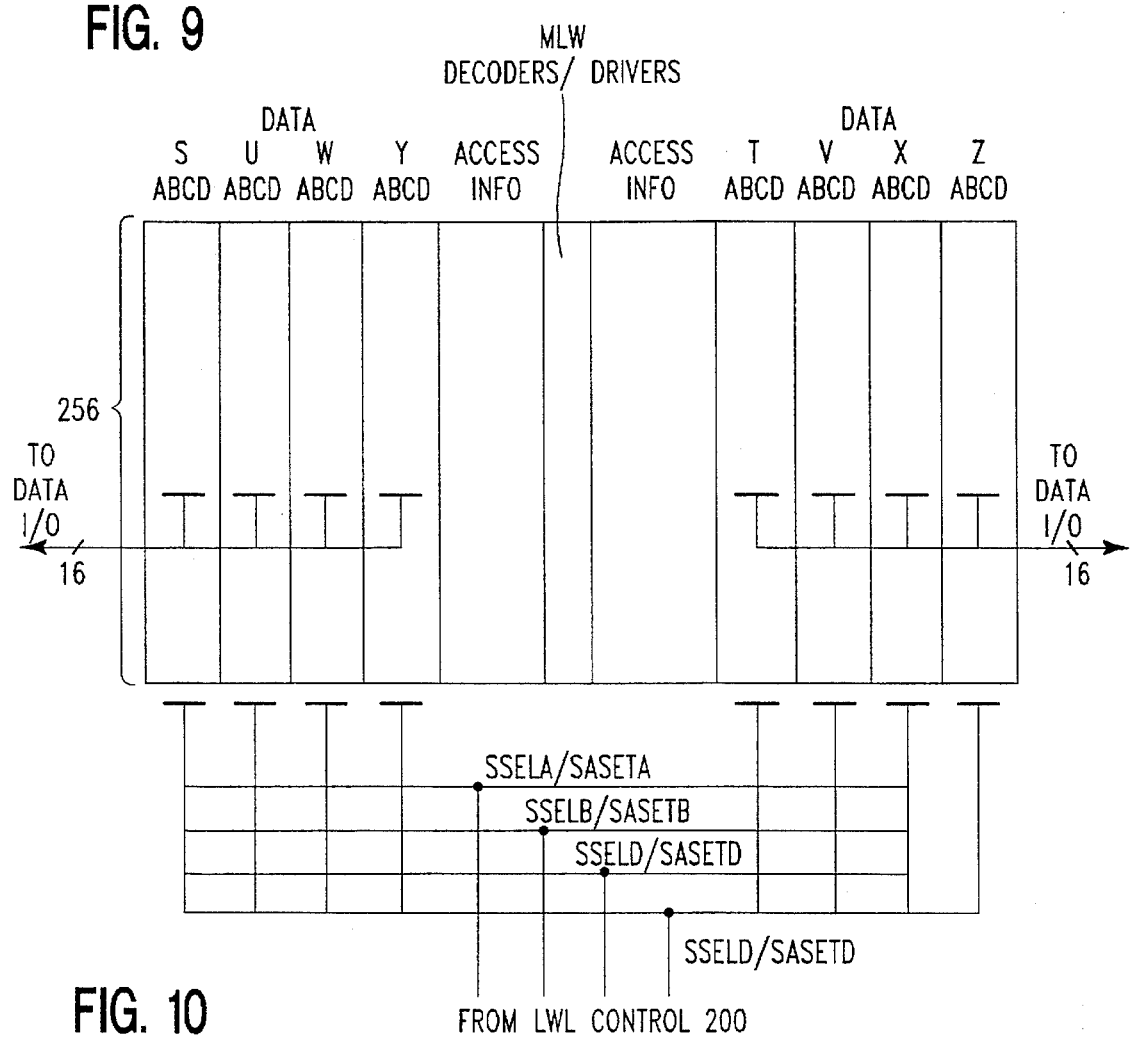
FIG. 10 is a more detailed diagram of the data arrays of FIG. 3, illustrating the layout of the arrays and the receipt of enable signals.

As shown in FIG. 10, these signals are used to activate selected portions of the array 41. As shown in FIG. 10, note that the cache line data is disposed on either side of the master word line decoders/drivers disposed at the center of the array. As previously stated, in practice the cache lines are broken up into eight local word lines. In the embodiment shown in FIG. 10, the cache arrays are disposed such that the first local word lines for each cache line (i.e. those that store bytes 0 and 1 of the first data word 0) are in a first subarray S, the second local word lines for each cache line (i.e. those that store bytes 2 and 3 of the first data word 0) are in a second subarray T disposed on the other side of the master word line decoders, the third local word lines are in a third subarray U adjacent array S, and so on. The HITA–HITD signals are sent to each LWL CONTROLLER in each subarray S–Z. As previously stated, there are 32 LWL CONTROLLERS 200, each providing a discrete set of SSEL and SASEL signals. A set of signals SASELA-D and SSELA-D is shown for ease of illustration. At the start of the access cycle, all of the section select signals SSELA-S-SELD will be brought high for the desired word, and all of the local word lines of that word will be enabled for the selected master word line (i.e. the selected set). However, once the TAGs have been compared and a hit detected (e.g. HITA stays high and HITB-D fall as described above), only the SSELA signal from LWL CONTROLLER will stay high, the rest of the signals SSELB-D will fall and the SASETA signal will go high. As shown in FIG. 11A, the local word line drivers receive SSELA-D as enable inputs, such that only the local word lines for cache line A will be enabled for the entire access cycle, the remaining local word lines being deselected and deactivated. As shown in FIG. 11B, the sense amps that receive SASETA as activation signals will operate for the entire sense cycle, the remaining sense amps being disabled, disabling the associated bit lines.

The overall operation is shown in FIG. 12. At the start of the cycle the accessed set is enabled (e.g. MWL0 is enabled, with the remaining master word lines remaining deactivated). As a result, the data stored on the master word line memory cells storing the access data (e.g. CELL B as shown in FIGS. 4 and 7) are accessed, driving their associated bit lines (e.g. BLA, BLB). A little later in the cycle LWL0–4 will be enabled, and all of the proper local word lines will begin to turn on. However, as described above if a HIT A is detected, only LWL0A will continue to be enabled to drive the associated bit lines BLC, BLD, with the remaining local word lines (as well as their associated sense amplifiers) being deactivated. Thus, the invention saves the unnecessary power consumption that is normally produced by maintaining all of the bit lines for the selected set enabled for the entire cycle. This result is achieved in large part by the master/local word line construction of the invention, which enables the access information to be sensed and output earlier in the cycle by virtue of direct connection of these cells to the master word lines.

As discussed above, the present invention supports a fully integrated LRU memory-to-cache write mode. As shown in FIG. 3, LRU CONTROL 150 receives the signal generated by exclusive OR gate 140. If this signal indicates a cache HIT, the control output of the LRU CONTROL 150 (as will be described in more detail below, the LRU still updates the stored LRU data during cache hit accesses). The access to the designated tag is continued as discussed above. If this signal indicates a cache MISS during a write cycle, the CPU must go to main memory for the data, and will store the data in the cache at the given index address at the cache line designated by the LRU CONTROL 150.

First, the LRU CONTROL 150 checks the status of the data valid bits from the VALID portion of the cache array. If any of these bits indicate that a given cache line A–D is storing invalid data, the LRU CONTROL 150 will output a two-bit signal corresponding to that given portion, and the LWL CONTROL 200 produces section select and sense amp enable signals as described above for that cache line. During this access cycle, the LWL CONTROL 200 will update the data valid bit for the selected cache line A–D to indicate that the selected portion is now storing valid data. In the next cycle, in the event of a cache MISS the data valid bits will again be interrogated, and any cache line in the selected set storing invalid index data will again be accessed.

This process will continue until all portions of the selected set store valid data. Then, if another cache MISS occurs for that given set, the LRU portion of the cycle is invoked. As shown in FIG. 3, the LRUA array in the cache is organized into four storage areas MRU1, MRU2, MRU3, and LRU. Each of these storage areas store a two bit signal corresponding to one of the cache lines. These 2 bits are the encoded equivalent of the HITA-D lines which are encoded by encoder ENC of FIG. 3 and are only valid when a HIT occurs. The MRU1 storage area stores a two-bit signal for the cache line A–D that was most recently used; the MRU2 storage area stores a two-bit signal for the cache line A–D that was next most recently used; the MRU3 storage area stores a two-bit signal for the cache line A–D that was next most recently used; and the LRU storage array stores a two-bit signal for the cache line A–D that was least recently used. Thus, in the LRU mode the portion A–D indicated by the LRU storage area will be accessed. The LRU CONTROL 150 simply outputs the two-bit signal stored by the LRU storage area, decodes it to 4 hit signals and sends it to the LWL CONTROL 200, and the section select and sense amp enable signals for that portion will be output. When the array is first powered up all the data in the LRUA array is random, but all the data valid bits indicate the data stored in the cache array is invalid because the valid bits are cleared at powerup.

FIGS. 13A–13I shows an example of a sequence of LRU operations on a single selected cache line at initial cache load, with the LRU data at power up assumed to be all zeroes for this example only. Each table shows the two-bit values MSB,LSB stored in the respective storage areas MRU1, MRU2, MRU3, and LRU. In the discussion to follow, assume that a two-bit signal of 0,0 corresponds to cache line A; signal 0,1 corresponds to cache line B; signal 1,0 corresponds to cache line C; and signal 1,1 corresponds to cache line D. As assumed above, at power up all of the LRU data is at 0,0. This is shown in FIG. 13A. As shown in FIGS. 13B–13E, the selected set is sequentially written at cache lines A, C, B, and D, respectively. This happens because the validity bits are all off during initial cache loading. Priority encoding is used to choose the order when multiple validity bits are off. Note that as each cache line is accessed, the LRUA data is effectively shifted from one LRUA storage area to the next, i.e. from MRU1 to MRU2, from MRU2 to MRU3, and from MRU3 to LRU. Thus, as shown in FIG. 13E, at the end of the initial cache load operation MRU1 stores the two-bit signal for cache line D, MRU2 stores the signal for cache line B, MRU3 stores the signal for cache line C, and LRU stores the signal for cache line A.

Then, as shown in FIGS. 13F–13H, different ones of the cache lines A–D of the same set are accessed during normal cache operations. More particularly, in FIG. 13G note that the cache line B is accessed, such that the two-bit signal representing cache line B (hereinafter referred to as an "indicator"), which was previously stored in area MRU3— see FIG. 13F, is now stored in area MRU1; the indicator that was previously stored in MRU1 is moved to MRU2; and the indicator that was stored in MRU2 is moved to MRU3. However, note that the least recently used data should not change—the LRU area previously stored the 1,0 indicator for cache line C (see FIG. 13F), and that data should not change in FIG. 13G, because cache line C is still the least recently used. So the invention includes LRU control circuits for terminating the shift at the LRU storage area in FIG. 13G. In other words, in the invention all the storage areas at or above the one that previously stored the indicator of the cache line currently accessed are updated, and those below that storage area are not. In the example shown in FIGS. 13F–13G, all the storage areas above (MRU1 and MRU2) the storage area that previously stored the representation of the cache index line currently accessed (MRU3, which previously stored the representation for portion B) are updated, while that storage area below that storage area (LRU) is not. Note that when we refer to storage areas being "above" or "below" one another we are referring to the storage areas that store the cache line indicators in decreasing order of recent usage. Thus, MRU1 is "above" MRU2, etc. The storage areas could be disposed in any given sequence along the master word lines, although as a practical matter a layout that approximates the foregoing logical relationship is preferred (that is, as shown in FIG. 3 the storage areas are laid out in sequence along the master word lines, such that they have adjacent bit line addresses).

In FIG. 13H cache line A is accessed, causing the A indicator to be reloaded from MRU2 to MRU1, and causing the old MRU1 data to be loaded into MR2. Again, note that the shifting stops at MRU3, the storage area below the MRU2 storage area which previously stored the indicator for the accessed cache line.

In FIG. 13H, a cache MISS (e.g. to portion B of the index data) is detected. In this case, the LRU storage area is unchanged. In a subsequent cycle, when data is being moved from memory to the cache, the data valid bits are interrogated. Assuming they all indicate that all of cache lines A–D store valid data, the main memory data will be written to cache line C, which was the cache line indicated in the LRU storage area in FIG. 13H as storing the least recently accessed data. In this case, because there are no storage areas "below" the LRU storage area, all of the data in the LRUA array will be shifted (compare FIG. 13I with FIG. 13H).

Figure 14:
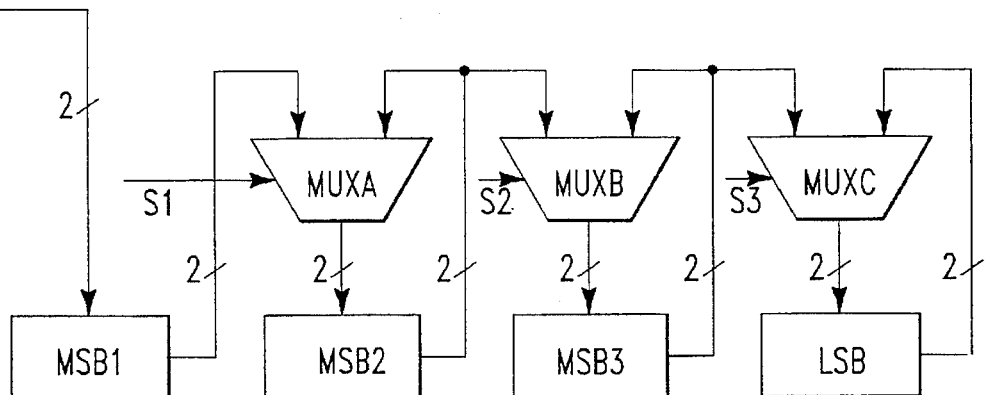
FIG. 14 is a circuit block diagram of the LRU CONTROL 150 shown in FIG. 3.
Figure 15:
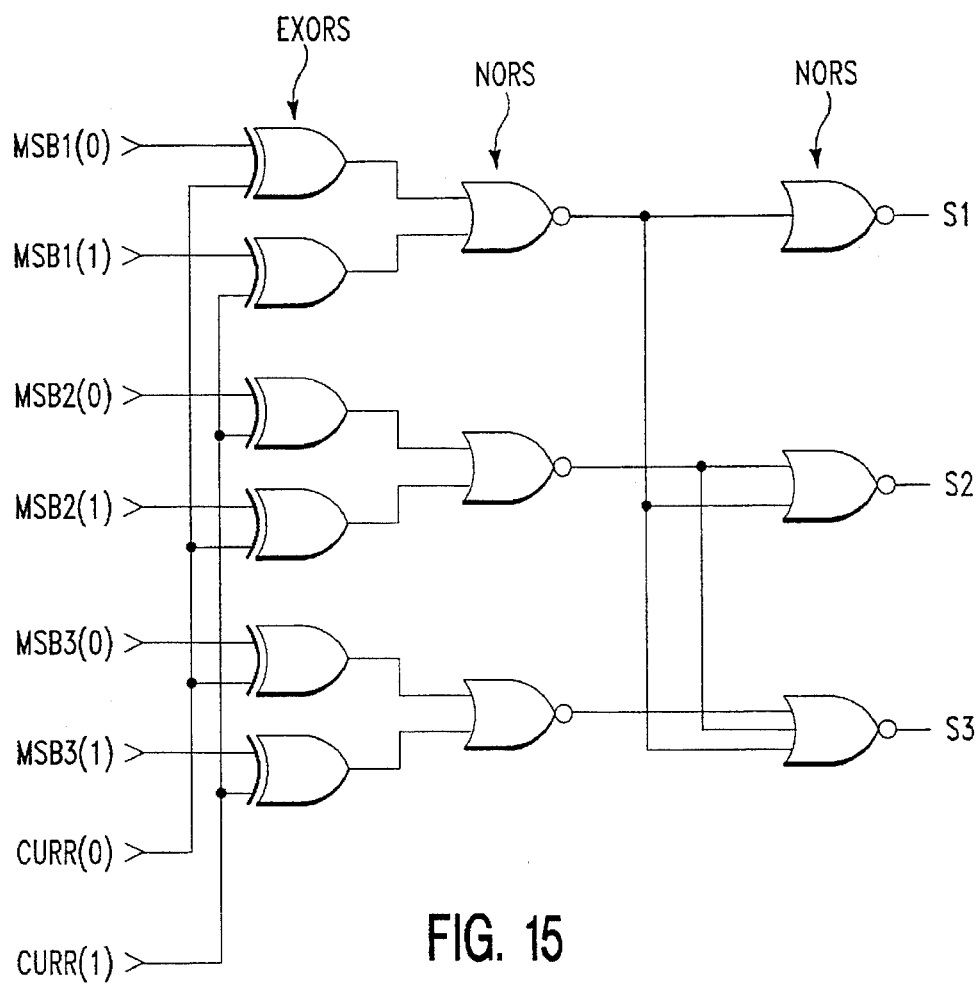
FIG. 15 is a circuit diagram illustrating the generation of the mux control signals shown in FIG. 14.

FIG. 14 is a circuit block diagram illustrating the hardware implementation of a portion of the LRU CONTROL 150. The circuit consists of three multiplexors MUXA-MUXC. The outputs of the multiplexors control the two-bit content of each of the LRUA storage areas MRU2, MSB3, and LSB, respectively. Each of the muxes receive as inputs the current indicators stored in their respective LRUA storage areas, as well as the indicators for the immediately more significant LRUA storage area. Thus, for example, MUXA receives the indicators stored in MRU1 and MRU2. The multiplexors are controlled by respective control signals S1–S3. As shown in FIG. 15, the least significant bit (0) and most significant bit (1) for each of the indicators currently stored in MSB1, MRU2, and MRU3 are compared with the least significant bit CURR(0) and most significant bit CURR (1) of the indicator for the currently accessed cache line. The circuit consists of sequential banks of exclusive ORs and NORs. The resulting signals S1–S3 will switch states depending on the comparison. For example, if cache line C is currently accessed, and the indicator for cache line C is currently stored in MRU3, the C indicator will be stored in MRU1, signal S1 will rise to cause MUXA to output the indicator previously stored in MRU1 into MRU2, signal S2 will rise to cause MUXB to store the indicator previously stored in MRU2 into MRU3, and signal S3 will stay low (because the indicator for the currently accessed line matched the indicator previously stored in MRU3), such that MUXC will not cause a shift and the LRU storage area will continue to store the same indicator it previously stored. This implementation of an LRU controller is simple and area efficient, facilitating the use of a true LRU algorithm that incorporates data validity checking.

It is to be understood that while various modifications may be made to the structures and teachings of the present invention as described above, various modifications may be made without departing from the spirit and scope of the present invention.

We claim:

1. A memory for storing data to be accessed by a processor, comprising:
    a plurality of word lines, each of said word lines comprising a master word line and a plurality of local word lines, each local Word line being responsive to and controlled by said master word line;
    a first plurality of memory cells coupled to each of said master word lines, said first plurality of memory cells storing memory access data; and
    a second plurality of memory cells coupled to each of said plurality of local word lines, said second plurality of memory cells storing data to be accessed by said processor, and at least some of said first plurality of memory cells storing memory access data corresponding to said data stored by said second plurality of memory cells.

2. The memory as recited in claim 1, wherein said first plurality of memory cells stores a plurality of validity bits indicating the validity of data stored in said second plurality of memory cells.

3. The memory as recited in claim 2, wherein said second plurality of memory cells store a plurality of data words, and said first plurality of memory cells store a plurality of bits indicating which of said plurality of data words was least recently accessed.

* * * * *